United States Patent
Hsu

(10) Patent No.: US 7,129,117 B2
(45) Date of Patent: Oct. 31, 2006

(54) METHOD OF EMBEDDING SEMICONDUCTOR CHIP IN SUPPORT PLATE AND EMBEDDED STRUCTURE THEREOF

(75) Inventor: Shih-Ping Hsu, Hsin-chu (TW)

(73) Assignee: Phoenix Precision Technology Corporation (TW)

( * ) Notice: Subject to any disclaimer, the term of this patent is extended or adjusted under 35 U.S.C. 154(b) by 0 days.

(21) Appl. No.: 11/008,964

(22) Filed: Dec. 13, 2004

(65) Prior Publication Data

US 2006/0049530 A1    Mar. 9, 2006

(30) Foreign Application Priority Data

Sep. 9, 2004    (TW) .............................. 93127248 A

(51) Int. Cl.
*H01L 21/48* (2006.01)

(52) U.S. Cl. .................. 438/112; 438/125; 438/622

(58) Field of Classification Search .................. None
See application file for complete search history.

(56) References Cited

U.S. PATENT DOCUMENTS 4,918,811 A * 4/1990 Eichelberger et al. ...... 438/107
6,876,554 B1 * 4/2005 Inagaki et al. .............. 361/763
6,964,887 B1 * 11/2005 Akagawa ..................... 438/126
6,991,966 B1 * 1/2006 Tuominen .................... 438/118

\* cited by examiner

*Primary Examiner*—Alonzo Chambliss
(74) *Attorney, Agent, or Firm*—William F. Nixon; Clark & Brody

(57) ABSTRACT

A method of embedding a semiconductor chip in a support plate and an embedded structure thereof are proposed. A first dielectric layer having a reinforced filling material is provided, and a semiconductor chip is mounted on the first dielectric layer. A support plate having an opening and a second dielectric layer having a reinforced filling material are provided. The first dielectric layer mounted with the semiconductor chip, the support plate, and the second dielectric layer are pressed together, such that the semiconductor chip is received in the opening of the support plate, and the dielectric layers fill in a gap between the semiconductor chip and the opening of the support plate. The reinforced filling material of the dielectric layers can maintain flatness and consistency of the semiconductor chip embedded in the support plate, and fine circuits can be fabricated on the support plate by build-up and electroplating processes.

19 Claims, 4 Drawing Sheets

METHOD OF EMBEDDING SEMICONDUCTOR CHIP IN SUPPORT PLATE AND EMBEDDED STRUCTURE THEREOF

FIELD OF THE INVENTION

The present invention relates to methods of embedding semiconductor chips in support plates and embedded structures thereof, and more particularly, to a method of embedding an integrated circuit chip in an opening of a support plate, and an embedded structure thereof.

BACKGROUND OF THE INVENTION

Along with developments of the semiconductor packaging technology, there have been produced many different packaging types of semiconductor devices. In the semiconductor device, a semiconductor chip is mounted on a package substrate or lead frame, and then electrically connected to the package substrate or lead frame; subsequently, an encapsulant is fabricated to encapsulate the chip and form a package. Ball Grid Array (BGA) package involves an advanced type of the semiconductor packaging technology, which is characterized by the use of a package substrate whose front side is mounted with a semiconductor chip and whose back side is implanted with a grid array of solder balls using a self-alignment technique. This allows more input/output (I/O) connections to be accommodated on the same unit area of a chip carrier (i.e. package substrate), so as to meet the requirement for a highly integrated semiconductor chip, such that the entire package can be electrically connected to an external device by means of the solder balls.

Referring to the conventional BGA semiconductor package, the semiconductor chip is mounted on the front side of the substrate and electrically connected to the substrate by a wire-bonding or flip-chip technique; then, the solder balls are implanted on the back side of the substrate to provide the I/O connections. Although the requirement for a large number of I/O connections is met, during high-frequency usage or high-speed operation, the quality of electrical performance cannot be maintained due to the excessively long electrically conductive path in such BGA package. Furthermore, the conventional packaging technology requires multiple connection interfaces, therefore increasing the fabrication cost thereof.

Accordingly, in order to effectively improve the electrical performance for the requirement of the next generation of products, there has been proposed to embed chips in a substrate and establish direct electrical connection between the chips and substrate so as to shorten the electrically conductive path and reduce signal losses and signal failures as well as improve the performance at high-speed operate.

Referring to FIG. 1, in order to embed a chip in an opening of a circuit board, firstly, at least one semiconductor chip 11 is mounted on a carrier film 10 in an upside-down manner that an active surface 110 of the chip 11 is attached to the carrier film 10. Subsequently, the carrier film 10 mounted with the chip 11 is attached to a support plate 12 having a predetermined opening 120, allowing the chip 11 to be received in the opening 120 of the support plate 12. The carrier film 10 is used to maintain flatness and height consistency of electrode pads 111 formed on the active surface 110 of the chip 11, such that electrical connection between the active surface 110 of the chip 11 and the support plate 12 can be effectively established after removing the carrier film 10.

In the above method, although the height consistency of the electrode pad 111 on the active surface 110 of the chip 11 is well maintained, when the chip 11 mounted on the carrier film 10 is embedded in the opening 120 of the support plate 12, an alignment error between the chip 11 and the opening 120 of the support plate 12 may occur due to expansion/contraction of the carrier film 10 during a temperature cycle of semiconductor device fabrication processes, thereby degrading the reliability of subsequent fabrication processes. Furthermore, the use of the carrier film 10 not only increases the fabrication cost but also may generate and release organic substances during high-temperature fabrication processes to contaminate the chip 11 mounted thereon.

FIG. 2 shows another method of embedding a semiconductor chip 21 in an opening 220 of a support plate 22. The semiconductor chip 21 is placed into the opening 220 of the support plate 22 one by one. Then, a resin 20 having a copper foil 200 is pressed onto the support plate 22 embedded with the chip 21 to allow the resin 20 to encapsulate the chip 21; or alternatively, the resin 20 can be directly filled in the opening 220 of the support plate 22 to fix the chip 21.

However, by the above method, the fabricated structure may have poor flatness due to the direct application of the resin 20 and makes it hard to be used in an advanced integrated circuit product. Moreover, although the resin 20 having the copper foil 200 may provide height consistency for an active surface 210 of the chip 21, it is not suitable for fabrication of fine circuits since an etching technique is employed to perform circuit fabrication on the copper foil 200. Furthermore, the number of circuit layers needs to be increased to meet the requirements of advanced products, such that the fabrication cost is increased while the size miniaturization of the product is not facilitated as a consequence.

SUMMARY OF THE INVENTION

In light of the above prior-art drawbacks, a primary objective of the present invention is to provide a method of embedding a semiconductor chip in a support plate and an embedded structure thereof, so as to effectively fix the semiconductor chip in place in the support plate.

Another objective of the present invention is to provide a method of embedding a semiconductor chip in a support plate and an embedded structure thereof, which can maintain flatness and consistency of the semiconductor chip being embedded in an opening of the support plate.

Still another objective of the present invention is to provide a method of embedding a semiconductor chip in a support plate and an embedded structure thereof, which can avoid an alignment error between the semiconductor chip and an opening of the support plate as well as difficulty in continuing subsequent fabrication processes.

A further objective of the present invention is to provide a method of embedding a semiconductor chip in a support plate and an embedded structure thereof, which can prevent the semiconductor chip from contamination due to organic substances generated and released by a carrier film for mounting the semiconductor chip during high-temperature fabrication processes.

A further objective of the present invention is to provide a method of embedding a semiconductor chip in a support plate and an embedded structure thereof, so as to improve the performance of the semiconductor chip.

A further objective of the present invention is to provide a method of embedding a semiconductor chip in a support plate and an embedded structure thereof, which can integrate the semiconductor chip and a carrier so as to provide more flexibility to meet customer demands as well as simplify the problems of fabrication processes, cost and interface integration for semiconductor device manufacturers.

A further objective of the present invention is to provide a method of embedding a semiconductor chip in a support plate and an embedded structure thereof, so as to facilitate subsequent fabrication of fine circuits.

In accordance with the above and other objectives, the present invention proposes a method of embedding a semiconductor chip in a support plate, comprising the steps of: providing a first dielectric layer having a reinforced filling material, and mounting at least one semiconductor chip on the first dielectric layer; providing a support plate having at least one predetermined opening and a second dielectric layer having a reinforced filling material; and pressing the first dielectric layer mounted with the semiconductor chip, the support plate, and the second dielectric layer together, with the support plate being disposed between the first and second dielectric layers, such that the semiconductor chip is received in the opening of the support plate, and the dielectric layers fill a gap between the semiconductor chip and the opening of the support plate.

In another preferred embodiment of the present invention, the method of embedding a semiconductor chip in a support plate comprises the steps of: providing a dielectric layer having a reinforced filling material, and mounting at least one semiconductor chip on the dielectric layer; providing a support plate having at least one predetermined opening and a carrier plate having an adhesive layer on a surface thereof; and pressing the dielectric layer mounted with the semiconductor chip, the support plate, and the carrier plate together, with the support plate being disposed between the dielectric layer and the carrier plate, such that the semiconductor chip is received in the opening of the support plate, and the dielectric layer fills a gap between the semiconductor chip and the opening of the support plate.

According to the foregoing method, the present invention also proposes an embedded structure having a semiconductor chip embedded in a support plate, the structure comprising a support plate having at least one opening; at least one semiconductor chip received in the opening of the support plate; and a dielectric layer having a reinforced filling material, which is formed on the support plate and fills a gap between the semiconductor chip and the opening of the support plate.

Therefore, by the method of embedding a semiconductor chip in a support plate and the embedded structure thereof proposed in the present invention, firstly, a dielectric layer having a reinforced filling material is provided, and a semiconductor chip is mounted on the dielectric layer. For embedding the semiconductor chip in a support plate, subsequently, the dielectric layer and the support plate are pressed together to allow the semiconductor chip to be received in an opening of the support plate and allow the material of the dielectric layer to fill a gap between the semiconductor chip and the opening of the support plate. The reinforced filling material such as glass fiber in the dielectric layer can provide better strength and reliability to reduce the occurrence of a poor control problem in fabrication processes due to expansion/contraction of a plate material in a thermal environment during semiconductor device fabrication processes. Also the reinforced filling material in the dielectric layer can assure the flatness and consistency of the semiconductor chip being embedded in the opening of the support plate, such that the semiconductor chip is effectively fixed in the opening of the support plate, and the reliability of circuit fabrication processes performed on the dielectric layer can be improved.

Moreover, the embedded structure proposed in the present invention is fabricated simply by pressing the dielectric layer with the support plate, and then a circuit build-up process can be performed on the support plate to fabricate circuits using semi-additive and electroplating techniques. As a result, fine circuits arranged in a high density and a low number of laminated layers can be formed on the embedded structure. Moreover, the present invention can integrate fabrication processes and packaging processes of a carrier for the semiconductor chip, thereby providing more flexibility to meet customer demands and simplify the fabrication processes and interface integration for semiconductor device manufacturers.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a method of embedding a semiconductor chip in a support plate and an embedded structure thereof proposed in the present invention are described in detail as follows with reference to FIGS. 3 to 5. The drawings are made in simplicity and not based on actual dimensions, and only illustrate the components or parts relevant to the present invention.

FIGS. 3A to 3D are cross-sectional views showing procedural steps of the method of embedding a semiconductor chip in a support plate according to a preferred embodiment of the present invention.

Figure 1A:
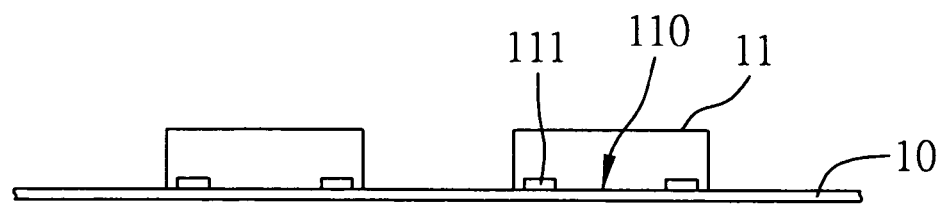
FIGS. 1A and 1B (PRIOR ART) are cross-sectional views showing a conventional method of embedding at least one semiconductor chip in a circuit board.
Figure 1B:
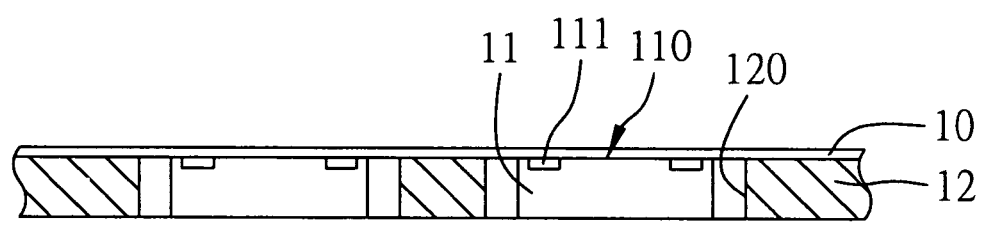
Figure 2:
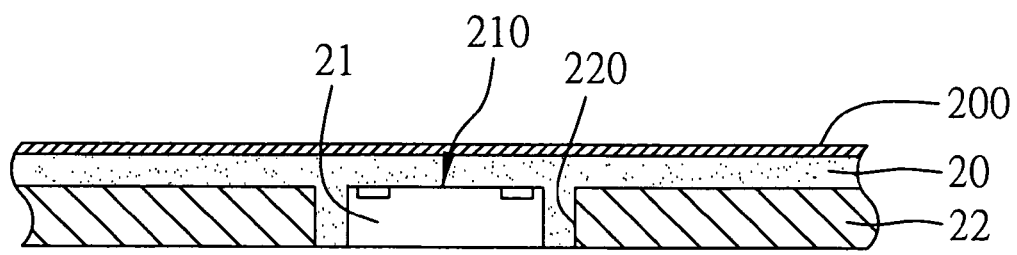
FIG. 2 (PRIOR ART) is a cross-sectional view showing another conventional method of embedding a semiconductor chip in a circuit board.
Figure 3A:
FIGS. 3A to 3D are cross-sectional views showing procedural steps of a method of embedding a semiconductor chip in a support plate according to a preferred embodiment of the present invention.
Figure 3B:
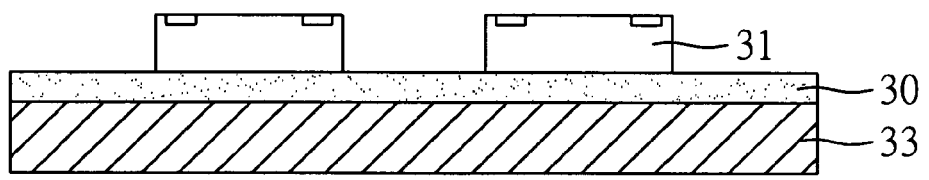

Referring to FIG. 3A, a dielectric layer 30 having a reinforced filling material is provided, wherein the reinforced filling material can be glass fiber. Then, a carrier plate 33 such as a metal plate can be attached to one side of the dielectric layer 30. Subsequently, referring to FIG. 3B, at least one semiconductor chip 31 is mounted on the dielectric layer 30 having the reinforced filling material, wherein the semiconductor chip 31 can be an active chip or chip-type passive component, and an active surface or an inactive surface of the semiconductor chip 31 can be mounted on the dielectric layer 30. The dielectric layer 30 having the reinforced filling material may be made of a glass-fiber prepreg ABF (Ajinomoto build-up film made by Ajinomoto Company, Japan) material; this material is also applicable for filling and for fabrication of fine circuits by a semi-additive process.

Figure 3C:
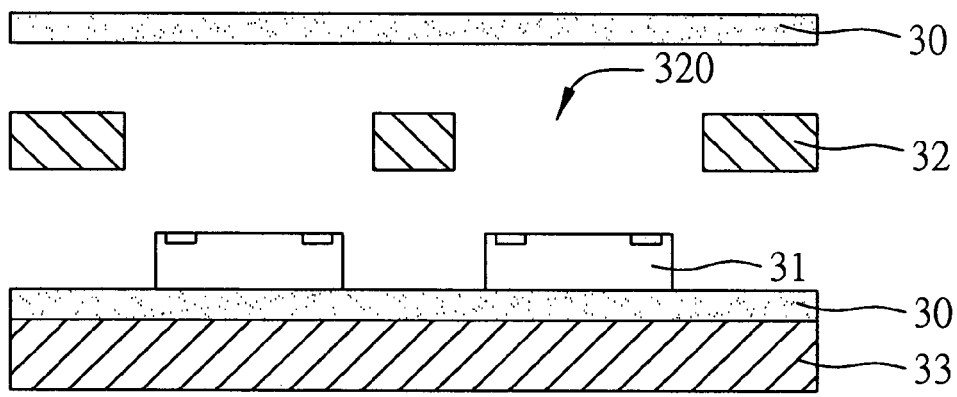

Referring to FIG. 3C, a support plate 32 having at least one predetermined opening 320 and another dielectric layer 30 (hereinafter referred to as "second dielectric layer") having a reinforced filling material are provided, wherein the support plate 32 can be a metal plate, insulating plate, or circuit board.

Figure 3D:
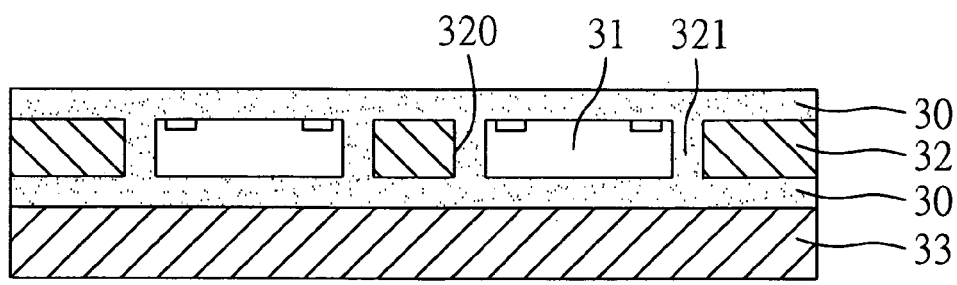

Referring to FIG. 3D, the dielectric layer 30 (hereinafter referred to as "first dielectric layer") with the carrier plate 33 being attached to one side thereof and the semiconductor chip 31 being mounted on the other side thereof, the support plate 32, and the second dielectric layer 30 are pressed together in a manner that the support plate 32 is disposed between the first and second dielectric layers 30. As a result, the semiconductor chip 31 is received in the opening 320 of the support plate 32, and the material of the first and second dielectric layers 30 fills a gap 321 between the semiconductor chip 31 and the opening 320 of the support plate 32, such that the semiconductor chip 31 is securely fixed in the opening 320 of the support plate 32. Also, the reinforced filling material such as glass fiber of the first and second dielectric layers 30 can provide better strength and reliability and eliminate a drawback such as warpage caused by expansion/contraction of a plate material in a thermal environment during semiconductor device fabrication processes. Thereby, the flatness and consistency of the semiconductor chip being embedded in the opening of the support plate can be optimally maintained, and the reliability of subsequent fabrication of build-up circuits on the dielectric layer can be improved. Afterwards, the carrier plate 33 can be removed.

FIGS. 4A to 4D are cross-sectional views showing procedural steps of the method of embedding a semiconductor chip in a support plate according to another preferred embodiment of the present invention.

Figure 4A:
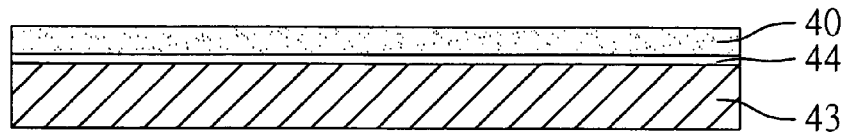
FIGS. 4A to 4D are cross-sectional views showing procedural steps of the method of embedding a semiconductor chip in a support plate according to another preferred embodiment of the present invention.

Referring to FIG. 4A, a dielectric layer 40 having a reinforced filling material is provided. The dielectric layer 40 can be attached to a carrier plate 43 via an isolation layer 44 such as a film. The carrier plate 43 can be a metal plate, and the dielectric layer 40 having the reinforced filling material can be made of a glass-fiber prepreg ABF material.

Figure 4B:
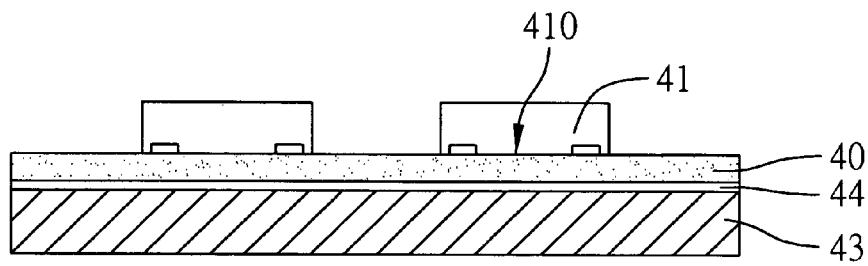

Referring to FIG. 4B, at least one semiconductor chip 41 is mounted via its active surface 410 on the dielectric layer 40. Subsequently, the carrier plate 43 is removed. The semiconductor chip 41 can be an active chip or chip-type passive component.

Figure 4C:
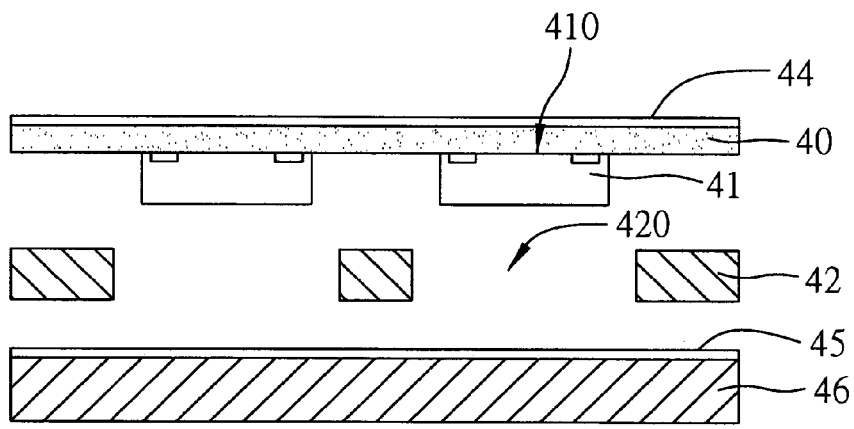

Referring to FIG. 4C, a support plate 42 having at least one opening 420 and a carrier plate 46 having an adhesive layer 45 on a surface thereof are provided. The support plate 42 can be a metal plate, insulating plate, or circuit board. The adhesive layer 45 can be a resin layer, and the carrier plate 46 can be a metal plate.

Figure 4D:
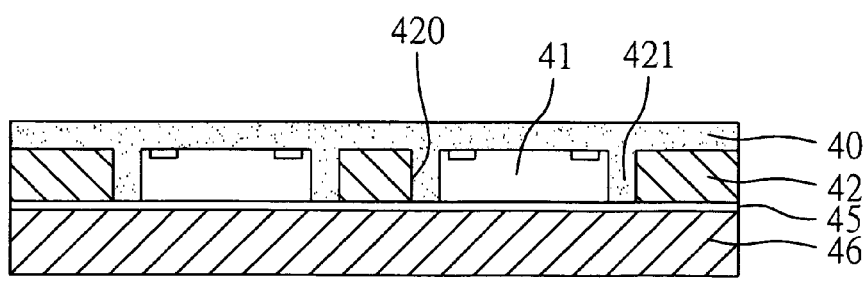

Referring to FIG. 4D, the dielectric layer 40 mounted with the semiconductor chip 41, the support plate 42, and the carrier plate 46 are pressed together, with the support plate 42 being disposed between the dielectric layer 40 and the carrier plate 46, such that the semiconductor chip 41 is received in the opening 420 of the support plate 42, and the material of the dielectric layer 40 fills a gap 421 between the semiconductor chip 41 and the opening 420 of the support plate 42. Afterwards, the isolation layer 44, the adhesive layer 45 and the carrier plate 46 can be removed.

Referring to FIGS. 3D and 4D, by the foregoing method, the present invention also proposes an embedded structure having a semiconductor chip embedded in a support plate, the structure comprising: a support plate 32, 42 having at least one opening 320, 420; at least one semiconductor chip 31, 41 received in the opening 320, 420 of the support plate 32, 42; and an dielectric layer 30, 40 having a reinforced filling material, which is formed on the support plate 32, 42 and fills a gap 321, 421 between the semiconductor chip 31, 41 and the opening 320, 420 of the support plate 32, 42.

Therefore, by the method of embedding a semiconductor chip in a support plate and the embedded structure thereof proposed in the present invention, firstly, a dielectric layer having a reinforced filling material is provided, and a semiconductor chip is mounted on the dielectric layer. For embedding the semiconductor chip in a support plate, subsequently, the dielectric layer and the support plate are pressed together to allow the semiconductor chip to be received in an opening of the support plate and allow the material of the dielectric layer to fill a gap between the semiconductor chip and the opening of the support plate. This thereby provides better reliability for subsequent fabrication processes, and the reinforced filling material in the dielectric layer can assure the flatness and consistency of the semiconductor chip being embedded in the opening of the support plate such that the semiconductor chip is effectively fixed in the opening of the support plate.

FIGS. 5A to 5D are cross-sectional views showing procedural steps of fabricating a subsequent build-up circuit structure on a support plate embedded with a semiconductor chip shown in FIG. 3D.

Figure 5A:
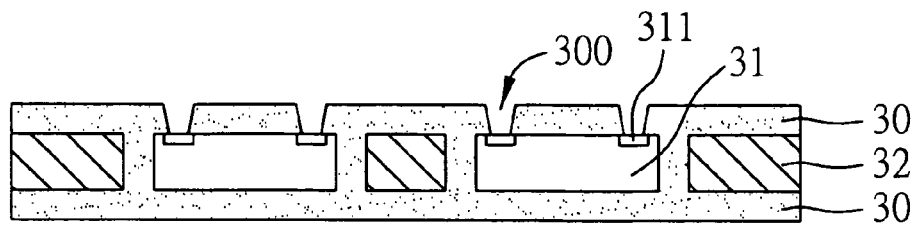
FIGS. 5A to 5D are cross-sectional views showing procedural steps of fabricating a subsequent build-up circuit structure on a support plate embedded with a semiconductor chip shown in FIG. 3D.

Referring to FIG. 5A, a plurality of openings 300 are formed in the dielectric layer 30 having the reinforced filling material by using an opening forming technique such as laser drilling technique, exposing/developing technique, or plasma etching technique. The openings 300 are located correspondingly to electrode pads 311 formed on the semiconductor chip 31 that is embedded in the support plate 32, such that expose the electrode pads 311 of the semiconductor chip 31 are exposed via the openings 300.

Figure 5B:
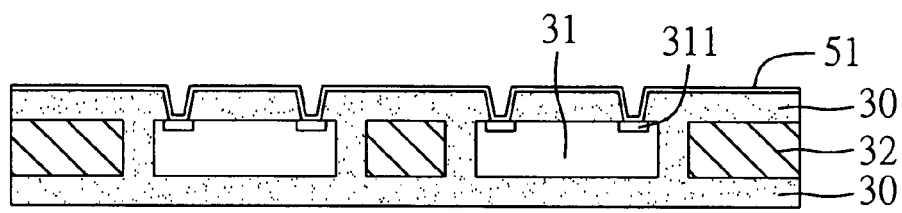

Referring to FIG. 5B, a conductive layer 51 is formed on the surface of the dielectric layer 30 having the openings 300 and also in the openings 300. The conductive layer 51 can be made of a metal layer or a conductive polymer material, and serves as a current conduction path required for a subsequent electroplating process.

Figure 5C:
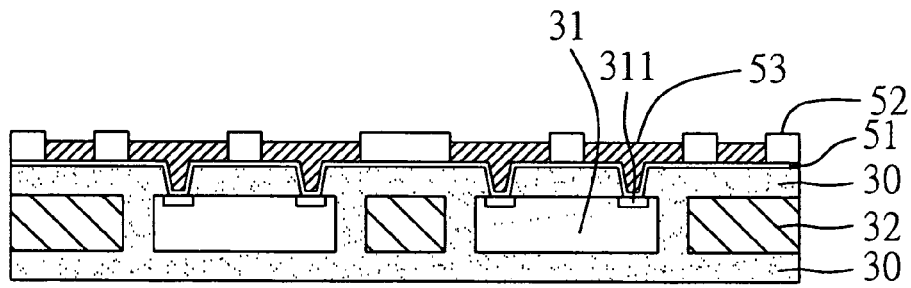

Referring to FIG. 5C, a resist layer 52 is formed on the conductive layer 51 and is patterned by e.g. exposing and developing techniques, such that a predetermined area of the conductive layer 51 where subsequent circuits are to be formed is exposed from the patterned resist layer 52. Then, a patterned circuit layer 53 is formed on the exposed area of the conductive layer 51 by an electroplating process and is electrically connected to the electrode pads 311 of the semiconductor chip 31.

Figure 5D:
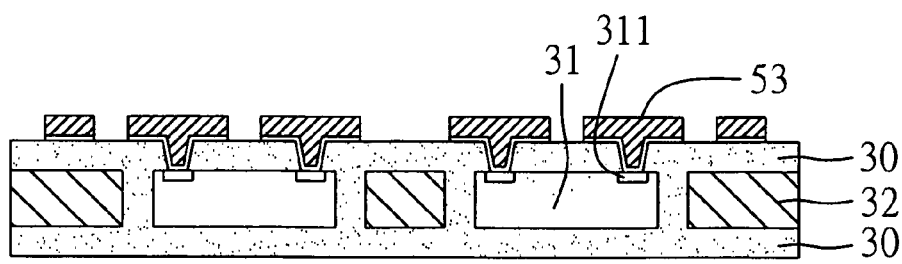

Referring to FIG. 5D, after forming the patterned circuit layer 53, the resist layer 52 and the conductive layer 51 covered by the resist layer 52 can be removed. The circuit build-up process can be continued subsequently on the above patterned circuit layer to fabricate desirable circuitry according to an intended electrical design. It could provide for the electrical connection with the electronic device.

Therefore, the embedded structure proposed in the present invention is fabricated simply by pressing the dielectric layer having the reinforced filling material with the support plate, and then a circuit build-up process can be performed on the support plate to fabricate circuits using build-up and electroplating techniques. As a result, high-density fine circuits can be formed on the embedded structure. Moreover, the present invention can integrate fabrication processes and packaging processes of a carrier for the semiconductor chip, thereby providing more flexibility to meet customer demands and simplify the fabrication processes and interface integration for semiconductor device manufacturers.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of embedding a semiconductor chip in a support plate, comprising the steps of:
   providing a first dielectric layer having a reinforced filling material, and mounting at least one semiconductor chip on the first dielectric layer;
   providing a support plate having at least one predetermined opening and a second dielectric layer having a reinforced filling material; and
   pressing the first dielectric layer mounted with the semiconductor chip, the support plate, and the second dielectric layer together, with the support plate being disposed between the first and second dielectric layers, such that the semiconductor chip is received in the opening of the support plate, and the dielectric layers fill a gap between the semiconductor chip and the opening of the support plate.

2. The method of claim 1, further comprising the steps of:
   forming a plurality of openings in one of the dielectric layers at positions corresponding to electrode pads formed on the semiconductor chip, such that the electrode pads of the semiconductor chip are exposed via the openings;
   forming a conductive layer on a surface of the dielectric layer having the openings and in the openings;
   forming a resist layer on the conductive layer, and patterning the resist layer such that a predetermined area of the conductive layer is exposed from the patterned resist layer; and
   forming a patterned circuit layer on the exposed area of the conductive layer by an electroplating process.

3. The method of claim 2, further comprising a step of removing the resist layer and the conductive layer covered by the resist layer.

4. The method of claim 3, further comprising a step of performing a circuit build-up process on the patterned circuit layer to form a multi-layer circuit structure on the support plate.

5. The method of claim 1, wherein the semiconductor chip is one of an active chip and a chip-type passive component.

6. The method of claim 1, wherein the support plate is one selected from the group consisting of an insulating plate, metal plate, and circuit board.

7. The method of claim 1, wherein a carrier plate is attached to one side of the first dielectric layer, so as to allow the semiconductor chip to be mounted on the other side of the first dielectric layer.

8. The method of claim 1, wherein the dielectric layer having the reinforced filling material is made of a glass-fiber prepreg ABF material.

9. A method of embedding a semiconductor chip in a support plate, comprising the steps of:
   providing a dielectric layer having a reinforced filling material, and mounting at least one semiconductor chip on the dielectric layer;
   providing a support plate having at least one predetermined opening and a carrier plate having an adhesive layer on a surface thereof; and
   pressing the dielectric layer mounted with the semiconductor chip, the support plate, and the carrier plate together, with the support plate being disposed between the dielectric layer and the carrier plate, such that the semiconductor chip is received in the opening of the support plate, and the dielectric layer fills a gap between the semiconductor chip and the opening of the support plate.

10. The method of claim 9, further comprising the steps of:
    forming a plurality of openings in the dielectric layer at positions corresponding to electrode pads formed on the semiconductor chip, such that the electrode pads of the semiconductor chip are exposed via the openings;
    forming a conductive layer on a surface of the dielectric layer having the openings and in the openings;
    forming a resist layer on the conductive layer, and patterning the resist layer such that a predetermined area of the conductive layer is exposed from the patterned resist layer; and
    forming a patterned circuit layer on the exposed area of the conductive layer by an electroplating process.

11. The method of claim 10, further comprising a step of removing the resist layer and the conductive layer covered by the resist layer.

12. The method of claim 11, further comprising a step of performing a circuit build-up process on the patterned circuit layer to form a multi-layer circuit structure on the support plate.

13. The method of claim 9, wherein the semiconductor chip is one of an active chip and a chip-type passive component.

14. The method of claim 9, wherein the support plate is one selected from the group consisting of an insulating plate, metal plate, and circuit board.

15. The method of claim 9, wherein the dielectric layer is attached to another carrier plate via an isolation layer.

16. The method of claim 9, wherein the semiconductor chip is attached via an active surface thereof to the dielectric layer.

17. The method of claim 9, wherein the adhesive layer is a resin layer.

18. The method of claim 9, wherein the carrier plate is a metal plate.

19. The method of claim 9, wherein the dielectric layer having the reinforced filling material is made of a glass-fiber prepreg ABF material.

* * * * *